United States Patent [19]

Mehdizadeh

[11] Patent Number: 5,045,792
[45] Date of Patent: Sep. 3, 1991

[54] SPLIT AND NON-CIRCULAR MAGNETIC RESONANCE PROBES WITH OPTIMUM FIELD UNIFORMITY

[75] Inventor: Mahrdad Mehdizadeh, University Hts., Ohio

[73] Assignee: Picker International, Inc., Highland Hts., Ohio

[21] Appl. No.: 392,653

[22] Filed: Aug. 11, 1989

Related U.S. Application Data

[63] Continuation-in-part of Ser. No. 234,278, Aug. 19, 1988, Pat. No. 4,918,388, and a continuation-in-part of Ser. No. 199,202, May 26, 1988, Pat. No. 4,879,516, which is a continuation-in-part of Ser. No. 120,475, Nov. 13, 1987, Pat. No. 4,839,594, and Ser. No. 86,277, Aug. 17, 1987, Pat. No. 4,841,248, each is a continuation-in-part of Ser. No. 931,726, Nov. 17, 1986, Pat. No. 4,752,738, and Ser. No. 765,708, Aug. 14, 1985, Pat. No. 4,793,356.

[51] Int. Cl.[5] .............................................. G01R 33/20
[52] U.S. Cl. ...................................................... 324/318
[58] Field of Search ............................... 324/318, 322; 128/653 SC

[56] References Cited

U.S. PATENT DOCUMENTS

| | | | |
|---|---|---|---|
| 4,591,818 | 5/1986 | Butson | 335/299 |
| 4,607,225 | 8/1986 | Crooks | 324/318 |
| 4,665,368 | 5/1987 | Sugiyama et al. | 324/318 |
| 4,680,548 | 7/1987 | Edelstein et al. | 324/318 |
| 4,694,255 | 9/1987 | Hayes | 324/318 |
| 4,820,987 | 4/1989 | Mens | 324/318 |
| 4,844,077 | 7/1989 | Sano et al. | 128/653 |
| 4,845,430 | 7/1989 | Nakabayashi | 324/309 |
| 4,845,431 | 7/1989 | Sullenberger | 324/318 |
| 4,845,432 | 7/1989 | Overweg | 324/318 |
| 4,845,613 | 7/1989 | Netter et al. | 364/200 |
| 4,899,108 | 2/1990 | Fujita et al. | 324/318 |
| 4,906,933 | 3/1990 | Keren | 324/322 |

FOREIGN PATENT DOCUMENTS

| | | | |
|---|---|---|---|
| 0142760 | 5/1985 | European Pat. Off. | 324/322 |
| 2145230 | 1/1987 | United Kingdom . | |

OTHER PUBLICATIONS

IEEE Standard Dictionary of Electrical and Electronics Terms; Third Edition, Editor, F. Jay, p. 516, 1984.

*Primary Examiner*—Michael J. Tokar
*Attorney, Agent, or Firm*—Fay, Sharpe, Beall, Fagan, Minnich & McKee

[57] ABSTRACT

Radio frequency signals are introduced into a patient and magnetic resonance signals are received from the patient by a head probe (22) of a magnetic resonance apparatus. The head probe includes an upper probe portion (60) and a lower probe portion (62) which are selectively separable. The upper probe portion has a window (66) of about 90° at the top so the patient can see out easily and feel less claustrophobic. The upper and lower probe portions each include two coil sections (50, 52; 54, 56) connected in series. The coil sections include a plurality of conductor branches (40) connected in parallel around a cylinder. The position of the conductor branches is arbitrarily selected to accommodate the patient window and the like. From the Biot-Savart Law, the current flow through each of the conductor branches is determined. Capacitors $C_1, \ldots, C_n$ are connected into the current branches such that actual current flow $I_0, I_1, \ldots, i_n$ through each branch substantially meets the currents specified by the Biot-Savart Law.

12 Claims, 6 Drawing Sheets

SPLIT AND NON-CIRCULAR MAGNETIC RESONANCE PROBES WITH OPTIMUM FIELD UNIFORMITY

This application is a continuation-in-part of prior pending U.S. applications Ser. No. 234,278, filed Aug. 19, 1988, now U.S. Pat. No. 4,918,388 and Ser. No. 199,202, filed May 26, 1988, now U.S. Pat. No. 4,879,516, which in turn is a continuation-in-part of pending U.S. applications Ser. No. 120,475, filed Nov. 13, 1987, now U.S. Pat. No. 4,839,594; Ser. No. 086,277, filed Aug. 17, 1987, now U.S. Pat. No. 4,841,248; which are continuations-in-part of Ser. No. 931,726, filed Nov. 17, 1986, now U.S. Pat. No. 4,752,738, and Ser. No. 765,708, filed Aug. 14, 1985, now U.S. Pat. No. 4,793,356.

BACKGROUND OF THE INVENTION

The present invention relates to the field of radio frequency probe or coil design for magnetic resonance imaging and spectroscopy. The present invention finds particular application in conjunction with probes or coil designs which are not circularly symmetric and will be described with particular reference thereto. However, it is to be appreciated that the present invention is also applicable to circularly symmetric probes or coils in which conductor placement is not fully symmetric relative to all axes.

NMR probes are most commonly constructed either of wide foil sheets or a small cross section of wire conductors. The foil conductor probes include slotted tube resonators and Adelman-Grant resonators. In foil probes, the current distribution on the foil is determined by electromagnetic laws governing the nature of sheet currents and are not necessarily uniform. The wire type probes are exemplified by saddle coils and loop-type surface coils. Unlike foil probes which provide the designer with relatively little design discretion to adjust current densities, wire probes are readily adjustable. In wire type probes, the designer can shape the current distribution by choosing the proper location for conductors. For example, in saddle coils, angular locations of 120° and 60° have been determined to yield the best transverse uniformity. Hybrid probes in which wire type coils are constructed of foil strips in a saddle, loop, or like configuration, provide a compromise between the advantages of foil type probes and the design flexibility of wire type probes.

Previously, many efforts have been made to optimize the field uniformity of NMR probes. The geometries of single turn saddle coils and slotted tube resonators along a circular cylinder have been optimized for various diameters. Multi turn saddle coils provide increased uniformity for low frequency magnetic resonance imaging, but stray capacitive effects limit their utility at higher frequencies.

Among the most uniform probes is the bird cage coil illustrated in U.S. Pat. Nos. 4,680,548 and 4,694,255. In bird cage coils, a plurality of conductors are mounted longitudinally at equal spacings on the surface of a circular cylinder. Each conductor is interrupted by a capacitor, each of which has the same capacitance. Field uniformity is improved by increasing the number of symmetrically disposed conductors. The amplitude of the parallel conductor currents are weighted as a cosine function which yields an optimum uniformity. This optimum weighting is the result of the symmetrical arrangement of identical longitudinal conductor branches. Another drawback to the bird cage coil resides in the complexity of fine tuning. In order to maintain the symmetry around the circular cylinder, during tuning it is necessary for all capacitors to be adjusted to the same capacitance value.

Another approach for optimizing field uniformity is illustrated in U.S. Pat. No. 4,591,818 to Peter C. Butson. A plurality of conductors are arranged at spaced positions around a circular cylinder. The conductors, whose positions are mirror imaged about two orthogonal axes, have different cross sections. The conductors are arranged at precise 30° intervals and have different diameters. This difference in conductor diameter changes the relative impedance of the conductors, hence the amount of current flowing therethrough.

The present invention provides a new and improved method of designing coils with uniform fields which allows the coils to be non-circular or otherwise unsymmetric and the coils so designed.

SUMMARY OF THE INVENTION

In accordance with one aspect of the present invention, a method of constructing an RF probe for magnetic resonance apparatus is provided. A plurality of conductor branches are mounted along an examination region. With the standard relationships, such as the Biot-Savart Law, the current flows which maximize the field of uniformity in the examination region are calculated for each of the conductor branches. The self inductance of each conductor branch and the mutual inductance of each conductor with adjoining branches is calculated. An additional reactance, commonly a capacitance, is added to at least some conductor branches, which reactances are selected such that the current flow through the plurality of conductor branches matches the selected current flow pattern.

In accordance with another aspect of the present invention, an RF coil section is provided in which a plurality of conductor branches are connected in parallel. Reactances such as capacitors, are added to some of the branches such that the net reactance varies among the branches.

In accordance with the other aspects of the present invention, a plurality of the coil sections are connected in series; a plurality of the coils are connected in parallel; or a plurality of coils are interconnected in part in series and in part in parallel. In another aspect, a capacitance is connected across the feed to the coil sections for adjusting the resonant frequency of the coil.

In accordance with another aspect of the present invention, an improved saddle coil is provided. A first pair of conductor branches are connected in parallel; and a second pair of conductor branches are connected in parallel. The first and second pairs of branches are connected in series with first and second feed points. Reactances are added to some of the branches for adjusting the relative current flow through the branches to achieve a selected current pattern.

In accordance with a more limited aspect of the present invention, another pair of series connected coil segments of the same design is connected in parallel across the feed points.

In accordance with yet another aspect of the present invention, at least one of the coil segments are detachable and replaceable with a reactance module which mimics the removed coil segment.

One advantage of the present invention is that it provides a practical method for optimizing field uniformity.

Another advantage of the present invention is that it facilitates the design of non-uniform and non-circular magnetic resonance probes and coils.

Another advantage of the present invention is that it provides non-circular and non-symmetric magnetic resonance probes with improved magnetic field uniformity.

Still further advantages of the present invention will become apparent to those of ordinary skill in the art upon reading and understanding the following detailed description of the preferred embodiments.

BRIEF DESCRIPTION OF THE DRAWINGS

The invention may take form in various steps and arrangements of steps and in various components and arrangements of components. The drawings are only for purposes illustrating the preferred embodiments and are not to be construed as limiting the invention.

DETAILED DESCRIPTION OF THE PREFERRED EMBODIMENTS

Figure 1:
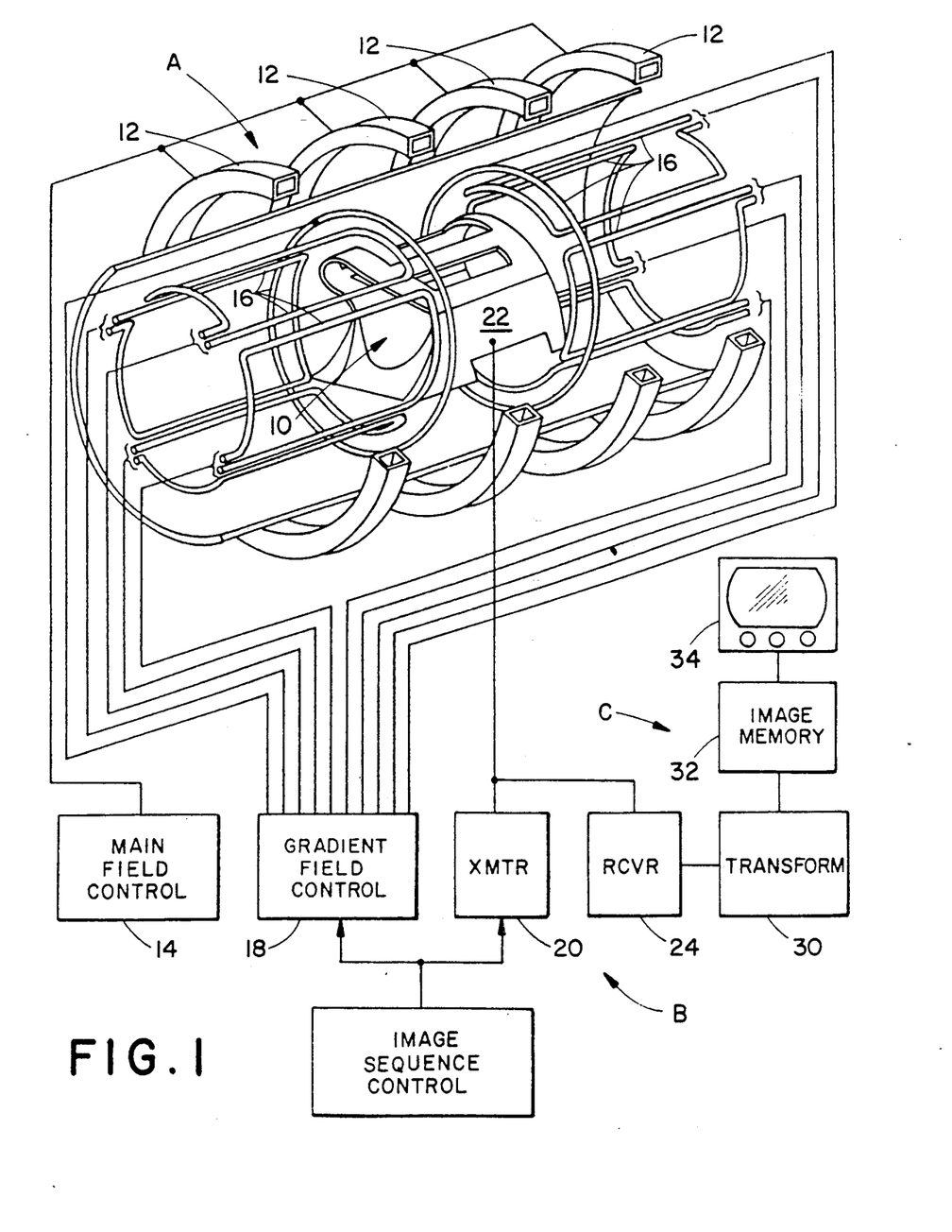
FIG. 1 is a diagrammatic illustration of a magnetic resonance imaging apparatus incorporating the present invention.

With reference to FIG. 1, a magnetic resonance imaging apparatus includes a magnetic field means A for generating magnetic fields and magnetic field gradients through an image of an examination region 10. A plurality of superconducting, resistive, or permanent magnets 12 create a substantially uniform, static magnetic field through the image region. A main magnetic field controller 14 controls superconducting and resistive magnets to optimize field uniformity. Gradient field coils 16 under the control of a gradient field controller 18 selectively cause magnetic field gradients across the image region. Commonly, gradients of selectable slope are selectively applied along one or more mutually orthogonal axes having an apex adjacent a center of the image region.

A resonance means B excites, manipulates, and recovers magnetic resonance of selected dipoles within the image region. More specifically, a radio frequency transmitter 20 selectively applies current pulses to a resonator probe 22 to excite selected dipoles in the image region to resonate or to tip or rotate the magnetization of resonating nuclei. The probe 22 functions as an antenna for a radio frequency receiver 24 to receive radio frequency magnetic resonance signals emanating from the resonating nuclei.

An image reconstruction means C reconstructs an image representation from the received magnetic resonance signals. A transform means 30 applies a two dimensional inverse Fourier transform or other appropriate transform to each received magnetic resonance signal to generate transformed views. An image memory 32 accumulates the transformed views into an image representation. The completed image representation can be displayed on a video monitor 34, stored on tape or disk, subject to further processing, or the like. An imaging sequence control means 36 controls the gradient field control means 18, the radio frequency transmitter 20, and other circuit components such that the imager implements a selected one of the many known magnetic resonance imaging sequences.

Figure 2:
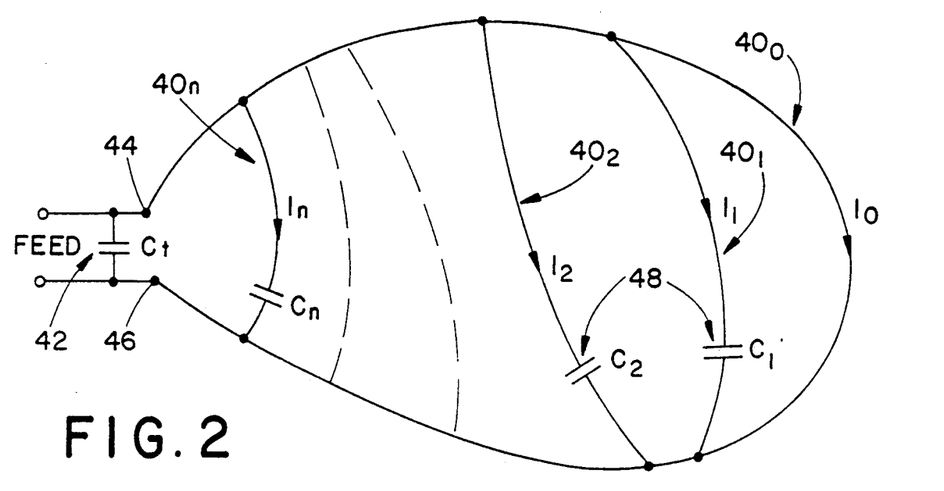
FIG. 2 is a diagrammatic illustration of an RF coil section in accordance with the present invention.

With reference to FIG. 2, the probe 22 includes at least one coil section that has a plurality n of conductor branches, $40_0$–$40_n$. The conductor branches may lie in two or three dimensions. A tuning reactance 42, such as capacitor $C_t$ is connected across the feed points 44, 46 of the coil section to adjust the resonant frequency of the coil to the Larmor frequency. The conductor branches include a plurality of reactances 48, particularly capacitors $C_1$–$C_n$. The capacitors are selected so that the current $I_0$–$I_n$ through each of the branches matches a pre-calculated current distribution.

For a uniform magnetic field, or a magnetic field of other preselected characteristics, the Biot-Savart Law or other known relationships dictates the current flow through each of the conductor branches. Each conductor branch has a self capacitance, as well as a mutual inductance with adjoining branches. The reactance of the self and mutual inductances and the capacitors determines the relative current flow through each of the conductor branches. The capacitors $C_1$–$C_n$ are selected to adjust the reactances of each branch such that the resultant currents $I_0$–$I_n$ match the currents prescribed by the Biot-Savart Law.

Figure 3:
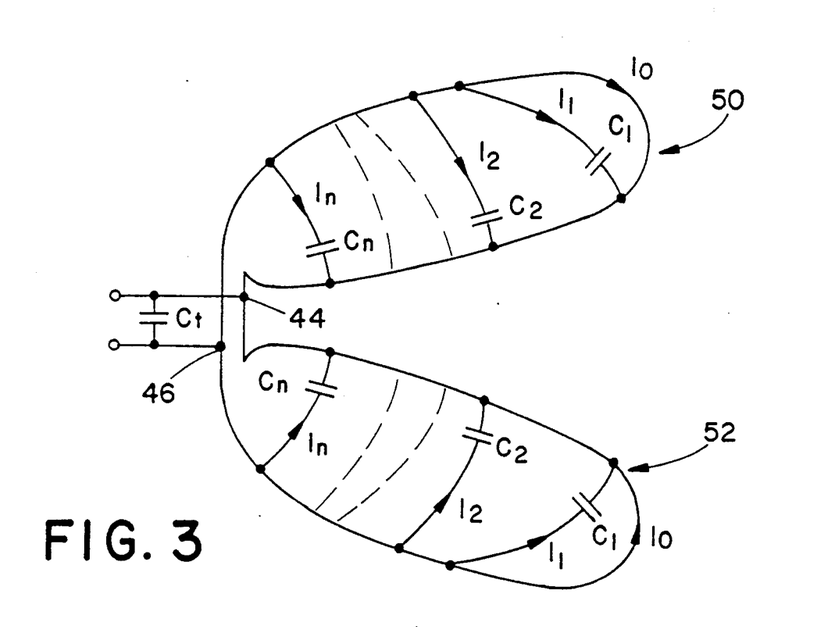
FIG. 3 is a general representation of a probe with two parallel coil sections.
Figure 4:
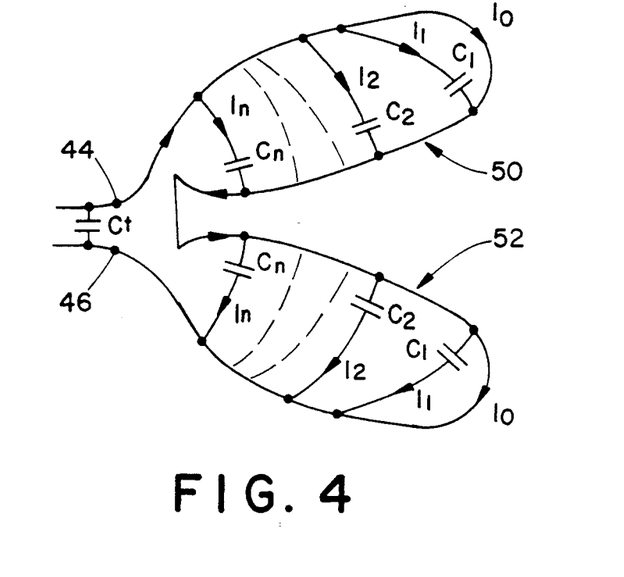
FIG. 4 is a representation of a probe with two series coil sections.
Figure 5:
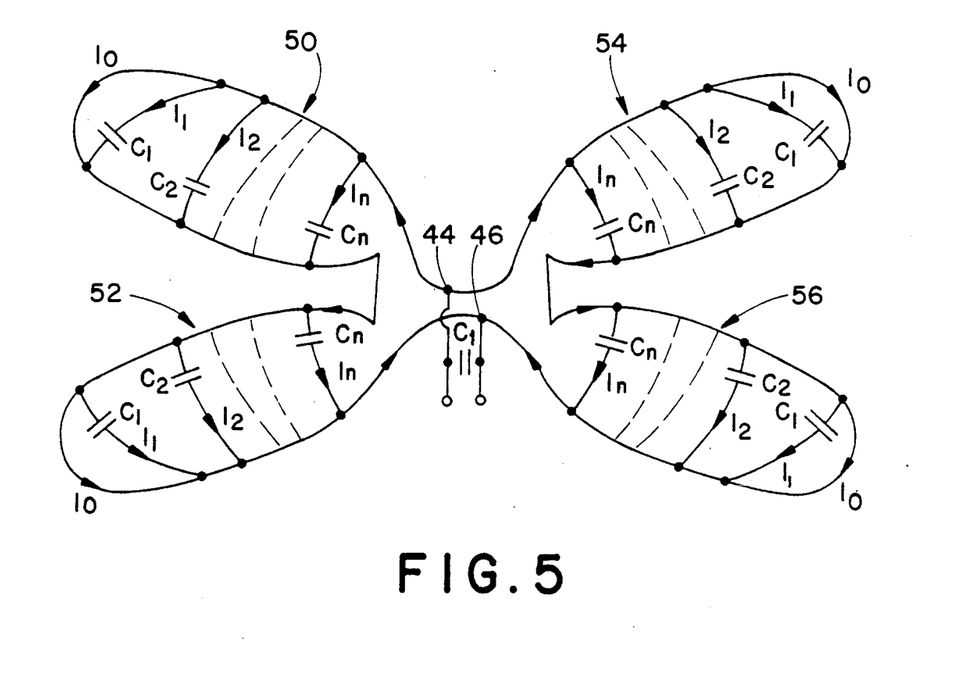
FIG. 5 is an illustration of a magnetic resonance probe with a combination of series and parallel connected coil sections.

With reference to FIG. 3, two or more coil sections 50, 52 may be connected in parallel to provide more current branches for improved uniformity in the image region. For design simplicity, it is preferred that the two sections have a two fold or planar symmetry. As illustrated in FIG. 4, two or more coil sections may be connected in series. Again, the sections are preferably arranged with two fold symmetry. With reference to FIG. 5, four of the coil sections 50, 52, 54, 56 are connected in a combination of parallel and series. More specifically to the illustrated embodiment, two pair of series connected coils are connected in parallel. For design simplicity, four fold symmetry is preferred.

Figure 6:
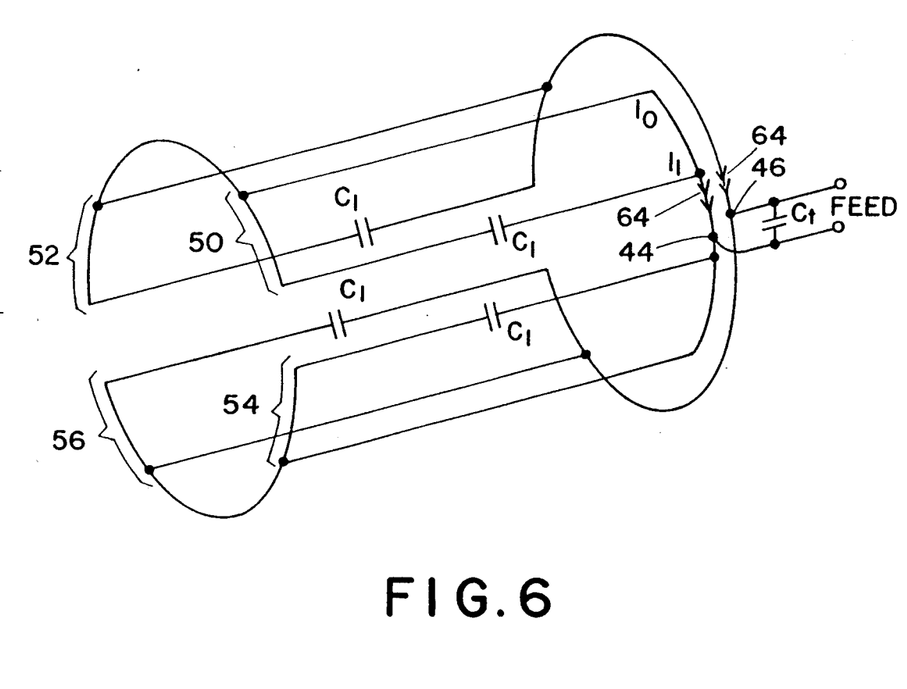
FIG. 6 illustrates a saddle coil electrical diagram of the probe of FIG. 1.
Figure 6A:
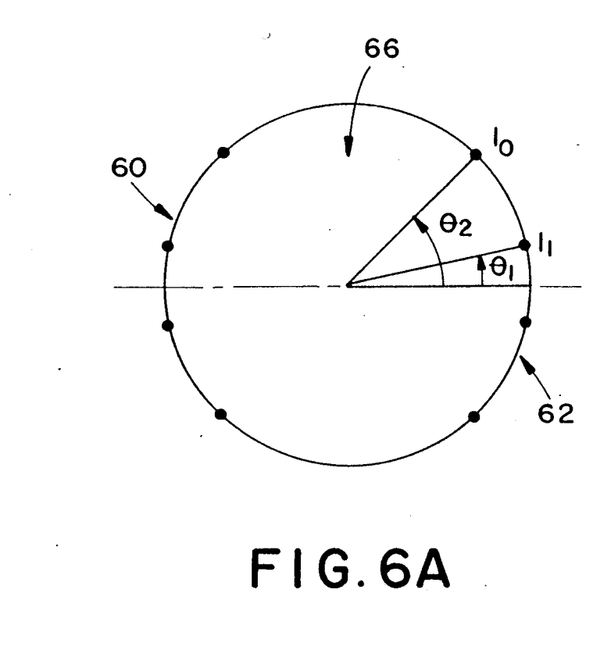
FIG. 6A is an end view of the saddle coil of FIG. 6.
Figure 7:
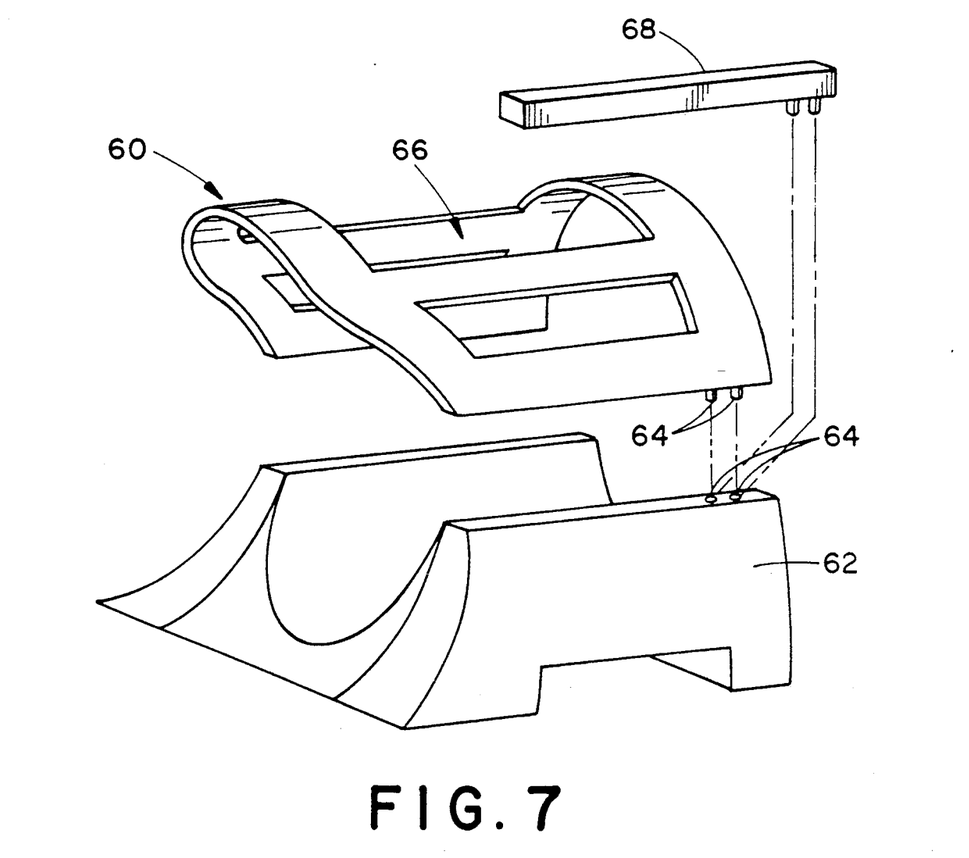
FIG. 7 is an enlarged view of the probe of FIG. 1 illustrating the removability of a top portion.

With reference to FIGS. 6, 6A, and 7, the probe 22 of the preferred embodiment is a saddle coil with four coil sections 50, 52, 54, and 56. Coil sections 50 and 52 are connected in series as are sections 54 and 56. The two series connected pairs are connected in parallel about the feed points 44, 46. In the preferred embodiment, each coil section has two conductor branches offset from a horizontal axis by angles $\theta_0$ and $\theta_1$ through which currents $I_0$ and $I_1$ flow, respectively. An adjustable reactance, preferably a capacitor $C_0$, is connected with the two conductor branches for adjusting the ratio of the current flow therethrough. Preferably, the reactance means is a capacitor in one of the branches or conductors. The capacitor is adjusted to achieve the relative current flow designated by the Biot-Savart Law. Alternatively, the field may be monitored and the capacitor iteratively adjusted until the uniformity of the field within the coil is optimized. The tuning capacitor $C_t$ across the feed points adjusts the resonance frequency of the probe.

The probe 22 includes two probe portions 60, 62, each of which extends generally around a half cylinder. A pair of electrical connectors 64 interconnect the two probe portions. The top probe portion, which is above the patient's face, is relatively open so as to be less claustrophobic. An open window 66 is defined in the center of the top portion and is open over 90° or more of arc. While window 66 provides openness in front of the patient's face, it's 90° span prevents the eight conductor branches of the preferred embodiment from being arranged symmetrically at like angles around the cylinder.

Figure 8:
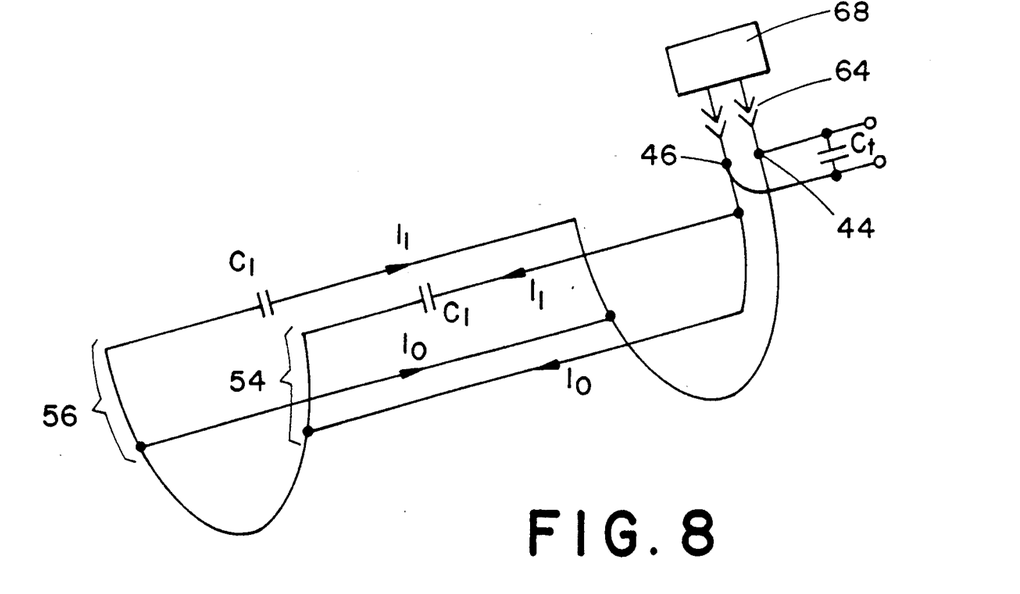
FIG. 8 is an electrical diagram of the bottom half of the probe of FIG. 7.

With continuing reference to FIG. 7 and further reference to FIG. 8, the top portion 60 of the coil is selectively removable, which enables the lower coil probe portion 62 to function as a neck and cervical spin coil. A reactive module 68 is connected with the connectors 64 in place of the top coil portion 60 to electrically connect an inductive/capacitive reactive load in place of the removed top coil segment. The reactive load of the reactive module 68 is selected to present the same reactance to the lower probe segment as the top coil segment presented. The reactive module maintains current continuity, tuning of the coil, and field uniformity without readjustment.

Figure 9:
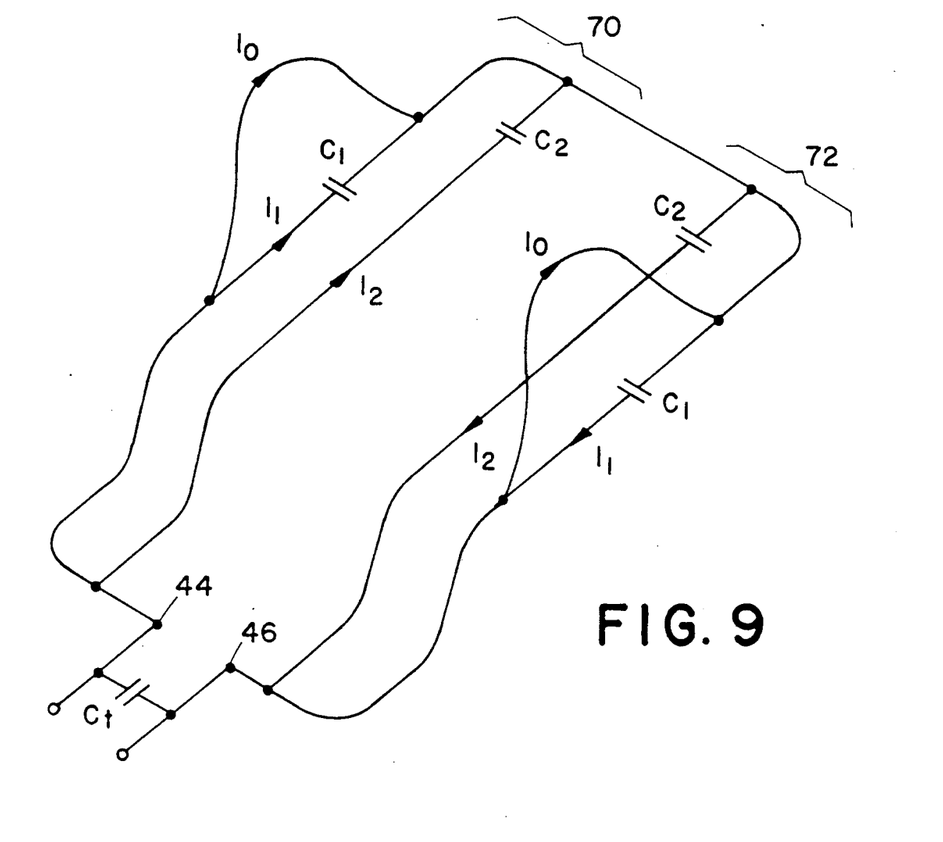
FIG. 9 is another alternate embodiment, ideally suited for cervical spin studies; and, FIG. 10 is an equivalent circuit diagram of a coil section.

In the embodiment of FIG. 9, two series connected coils sections 70 and 72 are connected across the feed points 44, 46. Each section has three conductors or branches connected in parallel. The capacitors $C_1$, $C_2$ are selected such that the current flows $I_0$, $I_1$, and $I_2$ match the current flows predicted to create the optimum field uniformity in the region of interest. Alternately, the capacitors may be adjusted iteratively by monitoring the uniformity of the magnetic field in the region of interest and adjusting the capacitors until the field uniformity is optimized.

Looking now to the preferred method for calculating design parameters, the capacitor $C_t$ resonates the probe or coil at a frequency $\omega$. In the absence of capacitors in each branch, the ratio between the currents $I_0, I_1, \ldots, I_n$ would be determined by geometry-dependent branch impedances. The impedance determined current distribution does not necessarily yield a desired field uniformity in the imaging region. To optimize the field uniformity, this method first determines the currents $I_0, I_1, \ldots, I_n$ which produces the optimum field distribution and then selects the capacitors $C_1, C_2, \ldots, C_n$ which causes the current to be divided among the branches such that the selected current distribution is achieved.

The current distribution is determined by a straight forward application of the Biot-Savart Law. In case of a circularly cylindrical coil volume, an angular cosine function for the currents yields optimum field uniformity. Numerical optimization techniques may also be utilized in some geometries.

Figure 10:
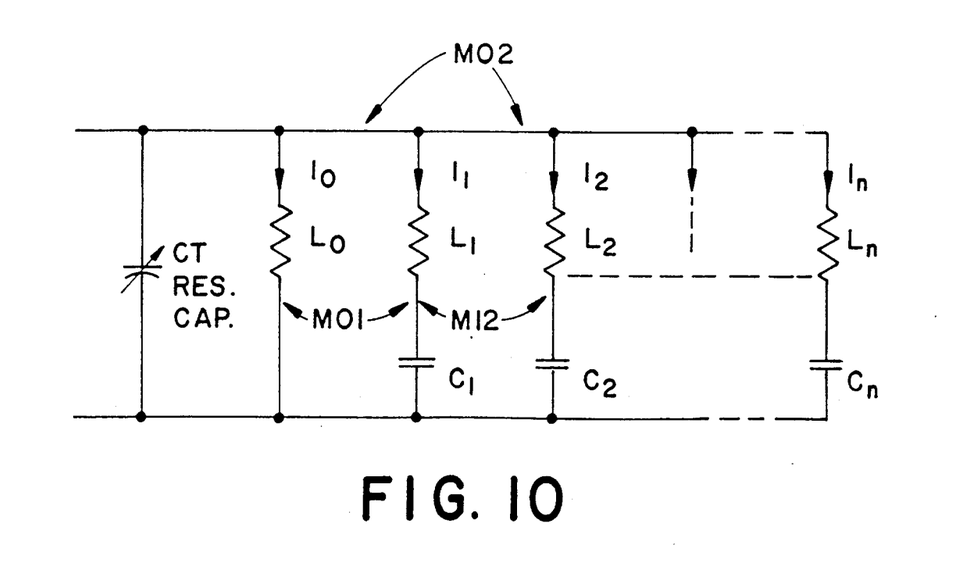

With reference again to FIG. 2 in which there are $n+1$ coil branches $40_o$–$40_n$, each of the coil branches has a self inductance $L_n$ and a mutual inductance with adjoining coils $M_{mn}$ (m$\neq$n). The equivalent circuit is illustrated in FIG. 10.

A ratio $\alpha_n$ of the current in the nth branch $I_n$, to the current in the first branch, $I_0$, is:

$$\alpha_n = \frac{I_n}{I_o}. \tag{1}$$

The self impedance $x_n$ of each branch is:

$$x_n = j\omega L_n + \frac{1}{j\omega C_n} \text{ and } x_o = j\omega L_o. \tag{2}$$

The mutual inductance $X_{mn}$ between branches is:

$$x_{mn} = j\omega M_{mn} \text{ (m}\neq\text{n)} \tag{3}$$

The impedance of $x_n$ of the nth branch, when accounting for all of the mutual inductances is then expressed:

$$x_n = \frac{\alpha_{n-1}}{\alpha_n} x_{n-1} + \sum_{i=1,n-2} \frac{\alpha_i}{\alpha_n} x_{i,n-1} + \sum_{i=n,N} \frac{\alpha_i}{\alpha_n} \quad (4)$$

$$x_{n-1,i} - \sum_{i=0}^{n-1} \frac{\alpha_i}{\alpha_n} x_{in} - \sum_{i=n+1}^{N} \frac{\alpha_i}{\alpha_n} x_{ni}.$$

The value of the capacitance $C_n$ for each branch is determined from Equation (2) to be:

$$C_n = \frac{1}{j\omega x_n + \omega^2 L_n}. \tag{5}$$

After all of the capacitor values are determined, the equivalent impedance of the coil when seen at the feed point $X_{eq}$ is:

$$X_{eq} = \frac{V}{\sum_{i=0,N} I_i} = \frac{V}{\sum_{i=0,N} I_o \alpha_i}, \tag{6}$$

where V is the voltage at the feed point. Stated in terms of the voltage at the feed point:

$$V = I_o \left[ X_o + \sum_{i=1..N} \alpha_i X_{oi} \right]. \tag{7}$$

Thus, for the resonant condition, the impedance of the resonating capacitor should be equal to $X_{eq}$, hence $C_t$ is expressed:

$$C_T = \frac{\sum_{i=0,N} \alpha_i}{\omega^2 \left[ L_o + \sum_{i=1,N} \alpha_i M_{oi} \right]}. \tag{8}$$

Applying this theory, the self and mutual inductances of the coil branches are measured first without the capacitor $C_n$. The self inductance of each coil is measured with the other branches disconnected, e.g. an open circuit where the capacitor is to be inserted. The mutual inductance $M_{mn}$ between branches M and N can be calculated based on Ohm's Law:

$$M_{mn} = L_{cmn} \left[ 1 - \left( 1 - \frac{L_m + L_n}{L_{cmn}} + \frac{L_m L_n}{L_{cmn}^2} \right)^{\frac{1}{2}} \right]. \tag{9}$$

where $L_m$ and $L_n$ are self inductances of coils and $L_{cmn}$ is the inductance of the two branches in parallel.

By way of example, in the embodiment of FIG. 6 in which each section has two branches, the capacitance, by Equations 4 and 5, is:

$$C_1 = \omega^2 \frac{a_1}{[a_1 L_i - L_o + M_{01}(1-a)]} \quad (10)$$

With four fold symmetry, all four sections 50, 52, 54, 56 can be analyzed analogously. In each coil section, the ratio of $I_1$ to $I_0$ of an experimental prototype was determined to be $a = 0.9$ and the angles between the branches were selected as $\theta_1 = 11.3°$ and $\theta_2 = 44°$. The self and mutual inductances for each branch were found to be $L_1 = 650$ nH, $L_2 = 490$ nH, and $L_{c01} = 430$ nH. From Equation (9), the mutual inductance $M_{01} = 160$ nH. The capacitance $C_1$ is calculated from Equation (10) to be 49 pF.

The invention has been described with reference to the preferred embodiments. Obviously, modifications and alterations will occur to others upon reading and understanding the preceding specification. It is intended that the invention be construed as including all such alterations and modifications insofar as they come within the scope of the appended claims or the equivalents thereof.

Having thus described the preferred embodiment, the invention is now claimed to be:

1. An R.F. magnetic resonance probe comprising:
a first coil section including a first plurality of conductor branches connected electrically in parallel;
a second coil section including a second plurality of conductor branches connected in parallel, the first and second sections being connected in series with their parallel branches lying physically parallel along a first half cylinder;
a third coil sections including a third plurality of conductor branches connected electrically in parallel;
a fourth coil section including a third plurality of conductor branches connected electrically in parallel, the third and fourth sections being connected in series with their conductor branches lying in parallel at non-uniform intervals along a second half cylinder;
a capacitor means connected in series with at least one of the conductor branches of each of the first, second, third, and fourth sections for adjusting a ratio of RF currents among the parallel connected branches for RF field uniformity within the first and second half cylinders; and
an electrical connection coupling for electrically connecting the third and fourth coil sections to the first and second coil sections as the first and second half cylinders are brought together into a cylinder.

2. A magnetic resonance probe comprising:
first and second coil sections each including at least two conductor branches connected in parallel and a capacitor means connected in series with at least one of the parallel connected conductor branches of each section such that the branches of each section have different added capacitances, the first and second coil sections being mounted with their branches in parallel along a surface of a first half cylinder;
third and fourth coil sections each of which includes at least two conductor branches connected in parallel and a capacitor means connected in series with at least one of the conductor branches of each section such that the conductor branches of each section have different added capacitances, the third and fourth coil sections being mounted with their conductor branches in parallel along a surface of a second half cylinder and an electrical connection coupling for electrically connecting the third and fourth coil sections to the first and second coil sections as the first and second half cylinders are brought together into a cylinder, the first and second half cylinders together have an oval cross section and the conductor branches are positioned at unequal angular increments around the cylinder.

3. A magnetic resonance probe comprising:
first and second coil sections each including at least two conductor branches connected in parallel and a capacitor means connected in series with at least one of the parallel connected conductor branches of each section such that the branches of each section have different added capacitances, the first and second coil sections being mounted with their branches in parallel along a surface of a first cylinder portion;
third and fourth coil sections each including at least two conductor branches connected in parallel and a capacitor means connected in series with at least one of the conductor branches of each section such that the conductor branches of each section have different added capacitances, the third and fourth coil sections being mounted with their conductor branches in parallel along a surface of a second cylinder portion, the conductor branches are arranged at unlike angular increments around the first and second cylinder portions, the cylinder portions defining a window which spans at least 90° which window is free of conductor branches, whereby the window reduces patient claustrophobia; and
an electrical connection coupling for electrically connecting the third and fourth coil sections to the first and second coil sections as the first and second cylinder portions are brought together.

4. An R.F. magnetic resonance probe comprising:
a lower probe portion including first and second coil sections connected in series, each coil section having at least two conductor branches connected electrically in parallel, which two conductor branches have different reactance values for adjusting a ratio of RF currents between the conductor branches of each section of the lower probe portion, the lower probe portion conductor branches lying generally along a lower portion of a surface of a cylinder;
an upper probe portion removably mounted to the lower probe portion, the upper probe portion including a plurality of conductor branches mounted generally along the surface of the cylinder, at least a portion of the upper probe conductor branches having different reactance values for adjusting a ratio of RF currents between the conductor branches of the upper probe portion.

5. The probe as set forth in claim 4 wherein the upper probe portion includes at least third and fourth coil sections each of which includes at least two conductor branches with different reactance values connected in parallel.

6. The probe as set forth in claim 5 wherein the first and second coil sections are connected in series between a pair of probe feed points and the third and fourth coil sections are connected in series between the probe feed points and further including an adjustable tuning capacitor connected across the feed points for selectively adjusting a resonance frequency of the probe.

7. A magnetic resonance probe comprising:
a lower probe portion including first and second coil sections, each coil section having at least two conductor branches connected in parallel, which lower probe portion conductor branches lie generally along a lower portion of a surface of a cylinder;
an upper probe portion removably mounted to the lower probe portion, the upper probe portion including a plurality of conductor branches mounted generally along the surface of the cylinder, the conductor branches of the upper probe portion being mounted at least 45° from a top center of the cylinder surface defining a conductor branch free window spanning at least 90° between conductor branches of the upper probe portion;
at least a portion of the conductor branches having different reactance values such that the conductor branches have a plurality of branch reactance values for controlling a distribution of RF currents among the conductor branches.

8. A magnetic resonance probe comprising:
a lower probe portion including first and second coil sections connected in series and mounted generally along a lower portion of a surface of a cylinder;
an upper probe portion removably mounted to the lower probe portion, the upper probe portion including third and fourth coil sections connected in series and mounted generally along the surface of the cylinder;
the first, second, third, and fourth coil section each including at least two conductor branches connected in parallel, one of the conductor branches of each section including an added capacitance, and the other conductor branch of each section being without an added capacitance.

9. A magnetic resonance probe comprising:
a first probe portion including first and second coil sections connected in series, each coil section having at least two conductor branches connected in parallel, which two conductor branches have different reactance values, the first probe portion conductor branches lying generally along a lower portion of a surface of a cylinder, the cylinder having an oval cross section;
a second probe portion removably mounted to the first probe portion, the second probe portion including a plurality of conductor branches mounted generally along the surface of the cylinder, at least a portion of the second probe portion conductor branches including a reactive element, the reactive elements having reactance values such that the conductor branches have a plurality of branch reactance values.

10. A magnetic resonance probe comprising:
a lower probe portion having at least first and second branches connected electrically in parallel and being mounted generally in parallel along a first surface, the first surface being curved in a direction orthogonal to the first and second conductor branches, the first and second conductor branches having different reactances and being electrically connected with a first electrical connection means;
an upper probe portion removably mounted to the lower probe portion, the upper probe portion including at least third and fourth conductor branches connected electrically in parallel and fifth and sixth conductor branches connected electrically in parallel, the parallel connected third and fourth conductor branches being connected in series with the parallel connected fifth and sixth conductor branches and a second electrical connection means, the third, fourth, fifth, and sixth conductor branches being mounted generally in parallel along a second surface at non-uniform intervals, the second surface being curved in a direction generally orthogonal to the third, fourth, fifth, and sixth conductor branches, the third and fourth conductor branches having different reactance values and the fifth and sixth conductor branches having different reactance values for controlling relative RF current flow between the third and fourth conductor branches and between the fifth and sixth conductor branches, the first and second electrical connection means electrically interconnecting the upper and lower probe portions when the upper probe portion is mounted to the lower probe portion.

11. The magnetic resonance probe as set forth in claim 10 further including a module that is removably mountable to the lower probe portion when the upper probe portion is removed, the module including a reactive load which is electrically connected with a third electrical connecting means, the third electrical connection means being electrically connected with the first electrical connection means when the module is mounted to the lower probe portion, the reactive load presenting substantially the same reactance to the lower probe portion as the removed upper probe portion, whereby the module maintains the turning of the lower probe portion when the upper probe portion is removed.

12. A magnetic resonance probe for transmitting radio frequency signals into a region of interest, the probe comprising:
first and second feed points which are adapted to be connected with a source of RF current;
at least first and second conductive branches connected electrically in parallel;
at least third and fourth conductive branches connected electrically in parallel, the first feed point, the first and second parallel connected branches, the third and fourth parallel connected branches, and the second feed point being connected electrically in series, such that RF current flowing from the first feed point is (i) divided into first and second RF current flows through the first and second branches, respectively, (ii) recombined, (iii) divided into third and fourth RF current flows flowing through the third and fourth branches, respectively, (iv) is recombined, and (v) flows to the second feed point, the first and second branches having different reactance values and the third and fourth branches having different reactance values for controlling a ratio of the first current flow to the second current flow and a ratio of the third current flow to the fourth current flow to optimize a uniformity of the RF signal transmitted from the first, second, third, and fourth branches into the region of interest.

* * * * *